United States Patent
Zhai et al.

(10) Patent No.: US 10,571,207 B2
(45) Date of Patent: Feb. 25, 2020

(54) FIXING DEVICE FOR DOUBLE SIDED HEAT SINK AND ASSOCIATED HEAT DISSIPATING SYSTEM

(71) Applicant: EMC IP Holding Company LLC, Hopkinton, MA (US)

(72) Inventors: Haifang Zhai, Shanghai (CN); Hendry Wu, Shanghai (CN); David Dong, Shanghai (CN); Yujie Zhou, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 16/172,081

(22) Filed: Oct. 26, 2018

(65) Prior Publication Data

US 2019/0170457 A1    Jun. 6, 2019

(30) Foreign Application Priority Data

Oct. 27, 2017    (CN) .......................... 2017 1 1025185

(51) Int. Cl.
  *H05K 7/20*    (2006.01)
  *H05K 1/02*    (2006.01)
  (Continued)

(52) U.S. Cl.
  CPC ........ *F28F 19/002* (2013.01); *F28D 15/0266* (2013.01); *F28D 15/0275* (2013.01);
  (Continued)

(58) Field of Classification Search
  CPC .. F28F 19/002; F28F 2280/02; F28F 2265/02; H01L 23/4006; H01L 23/427;
  (Continued)

(56) References Cited

U.S. PATENT DOCUMENTS 6,119,765 A * 9/2000 Lee .......................... G11C 5/00
                                                              165/185
6,307,748 B1 * 10/2001 Lin ..................... H01L 23/4093
                                                              165/80.3

(Continued)

*Primary Examiner* — Anatoly Vortman
(74) *Attorney, Agent, or Firm* — Ryan, Mason & Lewis, LLP

(57) ABSTRACT

Embodiments of the present disclosure relate to a fixing device for a double-sided heat sink and an associated heat dissipating system. There is exemplarily provided a fixing device for mounting the double-sided heat sink on a carrier. The fixing device comprises: a first holder including a first cylindrically-shaped rod, wherein the first cylindrically-shaped rod can pass through a first cooling portion of the double-sided heat sink and a mounting hole of the carrier to fix the first cooling portion to a first side of the carrier, and the first cylindrically-shaped rod comprises a through-hole extending along a longitudinal direction; and a second holder including a second cylindrically-shaped rod, wherein the second cylindrically-shaped rod can pass through a mounting hole of a second cooling portion of the double-sided heat sink and the through-hole of the first holder, such that the second holder is coupled with the first holder to fix the second cooling portion to a second side of the carrier opposite to the first side.

20 Claims, 5 Drawing Sheets

(51) Int. Cl.
*H05K 1/18* (2006.01)
*F28F 19/00* (2006.01)
*H01L 23/40* (2006.01)
*H01L 23/427* (2006.01)
*F28D 15/02* (2006.01)

(52) U.S. Cl.
CPC ........ H01L 23/4006 (2013.01); H01L 23/427 (2013.01); H05K 1/0203 (2013.01); H05K 1/18 (2013.01); H05K 7/2039 (2013.01); H05K 7/20336 (2013.01); H05K 7/20809 (2013.01); *F28F 2265/30* (2013.01); *F28F 2280/02* (2013.01); *H01L 2023/405* (2013.01); *H01L 2023/4031* (2013.01); *H01L 2023/4062* (2013.01); *H01L 2023/4087* (2013.01); *H05K 2201/064* (2013.01); *H05K 2201/066* (2013.01)

(58) Field of Classification Search
CPC ....... H01L 2023/4031; H01L 2023/405; H01L 2023/4062; H01L 2023/4087; H05K 1/0203; H05K 1/18; H05K 7/20336; H05K 7/2039; H05K 7/20809; H05K 2201/064; H05K 2201/066
USPC ........................................................ 361/719
See application file for complete search history.

(56) References Cited

U.S. PATENT DOCUMENTS

| | | | | |
|---|---|---|---|---|
| 6,449,156 B1* | 9/2002 | Han | ........................ | G11C 5/04 165/80.3 |
| 6,950,306 B2* | 9/2005 | Huang | .................. | H01L 23/467 257/706 |
| 7,180,743 B2* | 2/2007 | Chen | .................. | H01L 23/4093 165/185 |
| 7,232,332 B2* | 6/2007 | Osborn | ............... | H01L 23/4006 174/16.3 |
| 7,310,229 B2* | 12/2007 | Lee | ..................... | H01L 23/4093 257/718 |
| 7,342,796 B2* | 3/2008 | Aukzemas | ............ | F16B 37/145 165/185 |
| 7,362,573 B2* | 4/2008 | Lu | ........................ | H01L 23/4006 165/185 |
| 7,365,979 B2* | 4/2008 | Lee | ............................ | G06F 1/20 165/80.3 |
| 7,430,122 B2* | 9/2008 | Li | ........................ | H01L 23/4093 165/104.33 |
| 7,637,310 B2* | 12/2009 | Li | ........................ | H01L 23/4006 165/67 |
| 7,729,122 B2* | 6/2010 | Wong | .................. | H01L 23/4093 361/679.54 |
| 7,808,791 B2* | 10/2010 | Li | .......................... | F16B 5/0266 165/185 |
| 7,869,217 B2* | 1/2011 | Chen | ................... | H01L 23/4093 165/80.2 |
| 7,924,566 B2* | 4/2011 | Nie | ............................ | G06F 1/20 165/80.2 |
| 8,009,428 B1* | 8/2011 | Ye | ........................ | H01L 23/4093 165/80.3 |
| 8,089,768 B2* | 1/2012 | Mauder | ................ | G02B 6/4494 165/104.33 |
| 8,120,918 B2* | 2/2012 | Liu | ..................... | H01L 23/4006 165/104.33 |
| 8,479,804 B2* | 7/2013 | Liu | ..................... | H01L 23/4006 165/104.26 |
| 8,933,558 B2* | 1/2015 | Watanabe | ............... | H01L 23/10 257/706 |
| 2005/0265000 A1* | 12/2005 | He | ...................... | H01L 23/4006 361/709 |
| 2006/0007659 A1* | 1/2006 | Lee | ..................... | H01L 23/4006 361/704 |
| 2007/0217159 A1* | 9/2007 | Long | .................. | H01L 23/4093 361/704 |
| 2010/0032144 A1* | 2/2010 | Yang | .................. | H01L 23/4006 165/121 |
| 2010/0097766 A1* | 4/2010 | Wu | ..................... | H01L 23/4006 361/700 |
| 2010/0236765 A1* | 9/2010 | Liu | ..................... | F04D 25/0613 165/122 |
| 2010/0314080 A1* | 12/2010 | Cao | ........................... | G06F 1/20 165/121 |

* cited by examiner

FIXING DEVICE FOR DOUBLE SIDED HEAT SINK AND ASSOCIATED HEAT DISSIPATING SYSTEM

RELATED APPLICATIONS

This application claim priority from Chinese Patent Application Number CN 201711025185.1, filed on Oct. 27, 2017 at the State Intellectual Property Office, China, titled "FIXING DEVICE FOR DOUBLE SIDE HEAT SINK AND ASSOCIATED HEAT DISSIPATING SYSTEM" the contents of which is herein incorporated by reference in its entirety.

FIELD

Embodiments of the present disclosure relate to a fixing device for a double-sided heat sink and an associated heat dissipating system.

BACKGROUND

A high-density input/output card (I/O card) is generally used in a data server. Electronic devices, such as chips, on an I/O card would generate a large amount of heat during operation. Such heat must be dissipated timely through a heat dissipation apparatus to avoid damaging the electronic component. The traditional approach is to arrange a heat dissipation apparatus over the chip. However, as the input/output card is generally mounted upside down on the main board, the cooling portions of the heat dissipation apparatus are located in a narrow space between the I/O card and the main board, which leads to a sharp reduction of the performance of the heat dissipation apparatus.

SUMMARY

Embodiments of the present disclosure provide a fixing device for a double-sided heat sink and a heat dissipating system.

In a first aspect of the present disclosure, there is provided a fixing device for mounting a double-sided heat sink on a carrier. The fixing device comprises: a first holder including a first cylindrically-shaped rod, wherein the first cylindrically-shaped rod can pass through a first cooling portion of the double-sided heat sink and a mounting hole of the carrier to fix the first cooling portion to a first side of the carrier, and the first cylindrically-shaped rod comprises a through-hole extending along a longitudinal direction; and a second holder including a second cylindrically-shaped rod, wherein the second cylindrically-shaped rod can pass through a mounting hole of a second cooling portion of the double-sided heat sink and a through-hole of the first holder, such that the second holder is coupled with the first holder to fix the second cooling portion to a second side of the carrier opposite to the first side.

In some embodiments, the first holder comprises a first flexible latch located at a first end of the first cylindrically-shaped rod, and the first flexible latch is arranged to pass through the first cooling portion and the mounting hole of the carrier from the first side of the carrier to fix the first end of the first holder to the second side of the carrier.

In some embodiments, the first holder comprises a first flange located at a second end of the first cylindrically-shaped rod, and the first flange is arranged to limit the first cooling portion in the longitudinal direction.

In some embodiments, the first holder comprises a limiting protrusion adjoining the first flexible latch, and the limiting protrusion is arranged to define a gap between the second cooling portion and the second side of the carrier.

In some embodiments, the fixing device further comprises a cylindrically-shaped spring, which is arranged between the first flange and the first flexible latch.

In some embodiments, the second holder comprises a second flexible latch located at a first end of the second cylindrically-shaped rod, and the second flexible latch is arranged to pass through the mounting hole of the second cooling portion and the through-hole of the first holder from the second side of the carrier to couple the first end of the second holder to the second end of the first holder.

In some embodiments, the second holder comprises a second flange located at a second end of the second cylindrically-shaped rod, with the second flange being arranged to limit the second cooling portion in the longitudinal direction.

In some embodiments, the first flexible latch is formed in an inverted trapezoid shape.

In some embodiments, the second flexible latch is formed in an inverted trapezoid shape.

In a second aspect of the present disclosure, there is provided a heat dissipating system, comprising: a double-sided heat sink; a carrier on which a chip is arranged; and a fixing device according to the first aspect of the present disclosure to mount the double-sided heat sink on the carrier. The double-sided heat sink comprises: a first cooling portion arranged at a first side of the carrier and connectable to the chip; a second cooling portion arranged at a second side of the carrier opposite to the first side; and a heat pipe through which the first cooling portion and the second cooling portion are connected to perform heat transfer.

BRIEF DESCRIPTION OF THE DRAWINGS

Through the following detailed description with reference to the accompanying drawings, the above and other objectives, features, and advantages of example embodiments of the present disclosure will become more apparent. In example embodiments of the present disclosure, the same reference signs usually represent the same components.

DETAILED DESCRIPTION OF EMBODIMENTS

The technical solution of the present disclosure will be illustrated in greater detail below with reference to some embodiments. It should be appreciated that these embodiments are described to better explain and enable those skilled in the art to better understand the present disclosure and is not intended for limiting the scope disclosed herein.

On the basis of the embodiments given below, those skilled in the art can combine and adjust features of the embodiments in any manner, which shall belong to the scope of protection of the present disclosure.

As used herein, the term "comprises" and its variants are to be read as open-ended terms that mean "comprises, but is not limited to." The term "based on" is to be read as "based at least in part on." The term "one example embodiment" is to be read as "at least one embodiment." The term "another embodiment" is to be read as "at least another embodiment." The terms "first," "second" and others can denote different or identical objects. The following text may also contain other explicit or implicit definitions. Unless indicated otherwise, the meaning of the terms is consistent through the context of the present disclosure.

It is noticed that due to increasingly higher demand on storage capacity and storage speed in the data storage field, the conventional way of heat dissipation fails to maintain the operating temperature of the I/O card within a limited range, especially when the cooling portions of the heat dissipation apparatus are confined to a narrow space. To this end, the present disclosure provides an improved heat dissipating system.

Figure 1:
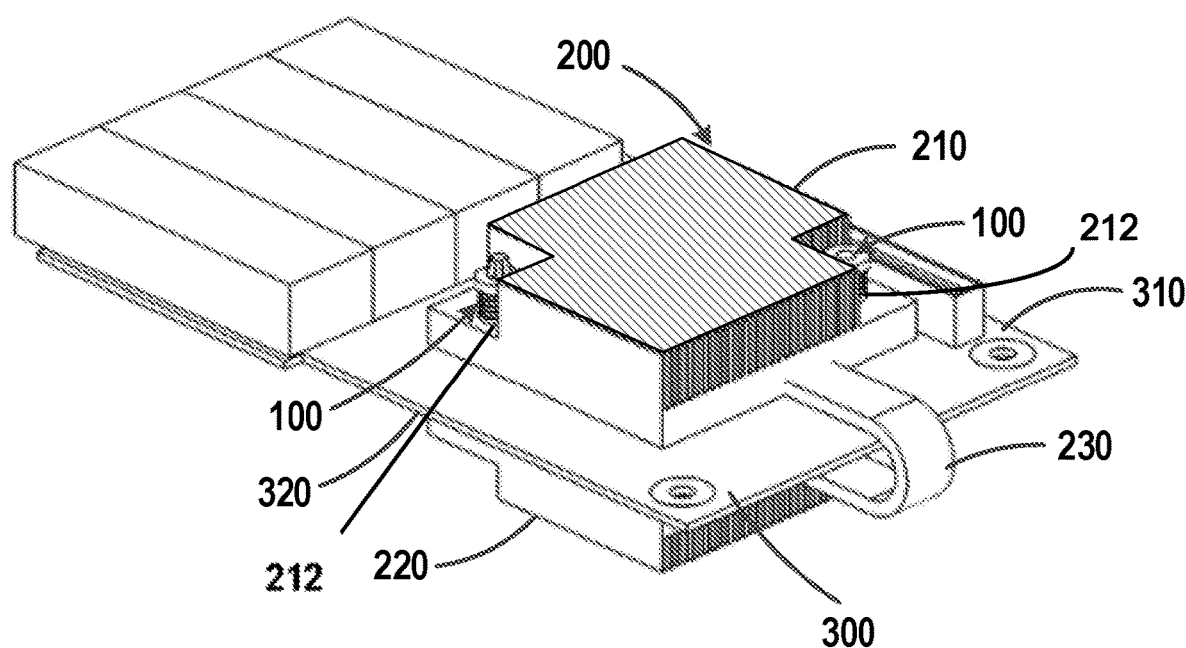
FIG. 1 illustrates a heat dissipating system comprising a fixing device and a double-sided heat sink in accordance with embodiments of the present disclosure.

FIG. 1 illustrates a heat dissipating system in accordance with embodiments of the present disclosure. The heat dissipating system comprises a double-sided heat sink 200 having two cooling portions 210 and 220. The double-sided heat sink 200 is fixed on a carrier 300 by means of a fixing device 100 according to the present disclosure. The carrier 300 is, for instance, a baseplate of an I/O card. To simplify the description, in the following, the upper side of the carrier 300 in FIG. 1 is referred to as a first side 310 and the lower side of the carrier 300 in FIG. 1 is referred to as a second side 320. Correspondingly, the cooling portion of the double-sided heat sink 200 located at the upper side of the carrier is referred to a first cooling portion 210 while the cooling portion located at the lower side of the carrier is referred to as a second cooling portion 220.

The chip 400 (FIG. 3) of the I/O card is, for instance, arranged at the first side 310 of the carrier 300. The first cooling portion 210 of the double-sided heat sink 200 is arranged adjacent to the chip 400 so as to reduce the temperature of the chip 400. For example, a silicon thermal conductive material may be coated on the chip 400 to facilitate contact of the chip 400 with the first cooling portion 210 and improve heat transfer from the chip 400 to the first cooling portion 210.

As mentioned above, the I/O card is generally mounted upside down on the main board, which causes the first cooling portion 210 to be confined within a narrow space between the carrier 300 and the main board, causing degradation of the heat dissipation performance. To this end, in embodiments of the present disclosure, a second cooling portion 220 is arranged at the second side 320 of the carrier 300. The first cooling portion 210 and the second cooling portion 220 are connected via a heat pipe 230 for heat transfer. The heat pipe 230 is made of metal material and straddles the first side 310 and the second side 320 of the carrier 300 from outside the carrier 300. In the embodiment of FIG. 1, the heat pipe 230 is U-shaped. It is understood that the heat pipe 230 may also be arranged in other shapes to connect the two cooling portions 210, 220.

During operation of the I/O card, the heat generated by the chip 400 is first transferred to the first cooling portion 210. By means of the heat pipe 230, a part of heat may be transferred from the first cooling portion 210 to the second cooling portion 220 so that the heat is dissipated more quickly. Compared with the first cooling portion 210, the second cooling portion 220 may be disposed in a ventilated open space, thereby having better heat dissipation performance.

The first cooling portion 210 and the second cooling portion 220 of the double-sided heat sink 200 are fixed by the fixing device 100. In the embodiment shown in FIG. 1, the first cooling portion 210 and the second cooling portion 220 each have two mounting holes 212, 222, respectively, disposed on a diagonal of the respective cooling portion so as to be fixed by means of two fixing devices 100. It is understood that the number of mounting holes 212, 222 is not limited and the mounting holes 212, 222 may also be disposed in other positions.

Figure 2:
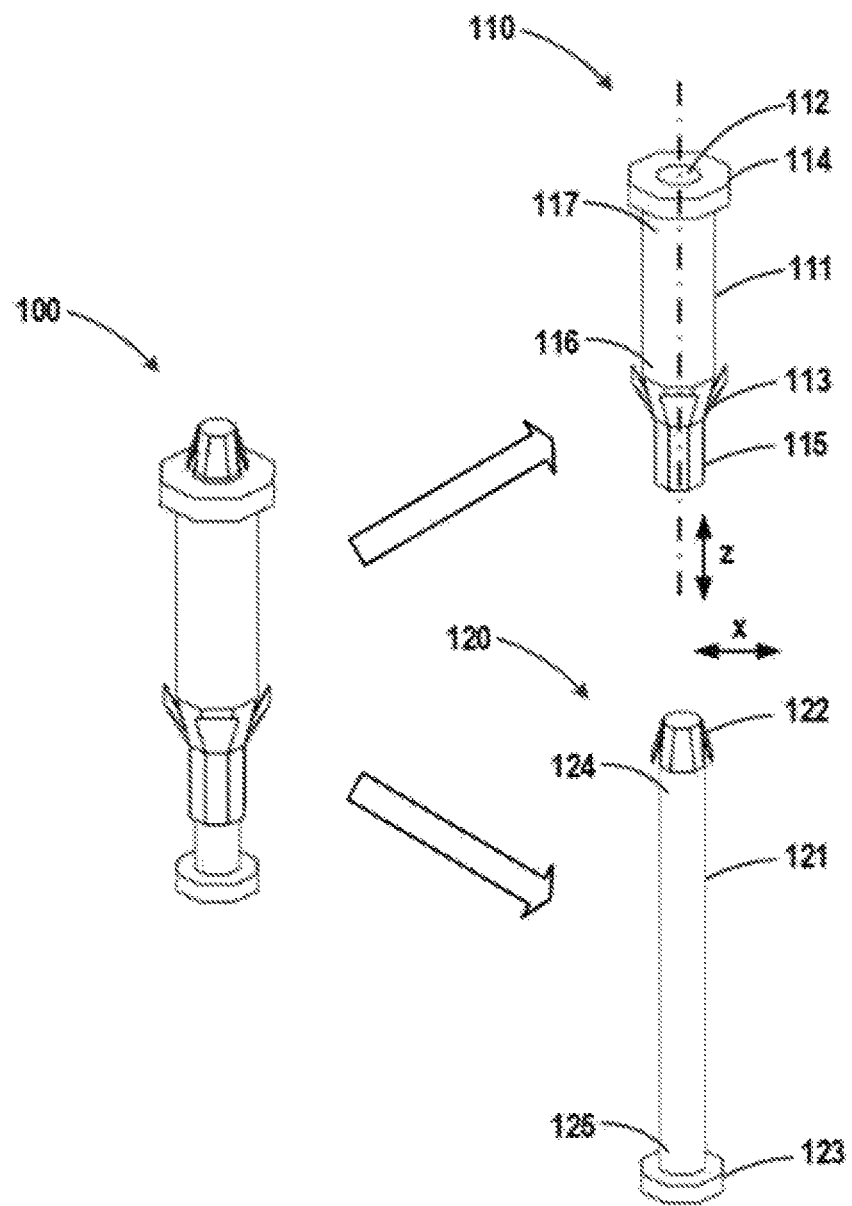
FIG. 2 illustrates a fixing device in accordance with embodiments of the present disclosure and an exploded view thereof.

FIG. 2 illustrates a fixing device 100 in accordance with embodiments of the present disclosure and an exploded view thereof. In embodiments of the present disclosure, the fixing device 100 shown in FIG. 2 may be disassembled into two parts 110 and 120 at the right side of FIG. 2. To simplify the description, in the following, the upper part at the right side in FIG. 2 is referred to as first holder 110 while the lower part at the right side in FIG. 2 is referred to as second holder 120.

As shown in FIG. 2, the main body of the first holder 110 is formed as a cylindrically-shaped rod. The main body is referred to as the first cylindrically-shaped rod 111 in the following. The first cylindrically-shaped rod 111 may pass through the mounting hole 212 of the first cooling portion 210 to fix the first cooling portion 210 on the first side 310 of the carrier 300. The center of the first cylindrically-shaped rod 111 is provided with a through-hole 112 extending along the longitudinal direction z.

In the embodiment of FIG. 2, the second holder 120 also has a cylindrically-shaped main body, which is hereinafter referred to as second cylindrically-shaped rod 121. The second cylindrically-shaped rod 121 of the second holder 120 is dimensioned to be adapted to the dimension of the through-hole 112 of the first holder 110 so that the main body of the second holder 120, namely, the second cylindrically-shaped rod 121 can be inserted into the through-hole 112 of the first holder 110 along the longitudinal direction z and coupled with the first holder 110, thereby fixing the second cooling portion 220 at a second side 320 of the carrier 300.

In some embodiments, as shown in FIG. 2, the first holder 110 comprises a first flexible latch 113 located at a lower end 116 of the first cylindrically-shaped rod 111. The first flexible latch 113 is formed in an inverted trapezoid shape. Specifically, the first flexible latch 113 protrudes from the first cylindrically-shaped rod 111 in the horizontal direction x perpendicular to the longitudinal direction z, and the outer peripheral dimension of the first flexible latch 113 gradually decreases from top to bottom.

When the first cooling portion 210 of the double-sided heat sink 200 is fixed, the first flexible latch 113 may pass through the mounting hole 212 of the first cooling portion 210 and the carrier 300 from the first side 310 of the carrier 300. By means of the first flexible latch 113 protruding outwards in the horizontal direction x, the lower end 116 of the first holder 110 can be fixed to the second side 320 of the carrier 300. In this manner, the first holder 110 can be prevented from tripping, and the first cooling portion 210 can be restricted from the lower side. Herein, due to the flexible design of the first flexible latch 113, the first holder 110 can be separated from the carrier 300 under the application of an external force.

In some embodiments, as shown in FIG. 2, the first holder 110 further comprises a first flange 114 located at an upper end 117 of the first cylindrically-shaped rod 111. The first flange 114 is formed to have a greater dimension than the first cylindrically-shaped rod 111 in the horizontal direction x. When the first holder 110 is inserted into the mounting hole 212 of the first cooling portion 210, the first flange 114 is fixed to the upper side of the first cooling portion 210, so as to limit the position of the first cooling portion 210 in the longitudinal direction z.

By means of the cooperating of the first flexible latch 113 and the first flange 114, the first cooling portion 210 can be limited from two sides in the longitudinal direction z via the first holder 110, so as to prevent the first cooling portion 210 from vibrating or shaking, for instance, during the transporting process.

In some embodiments, a cylindrically-shaped spring 130 is disposed between the first flange 114 and the first flexible latch 113 of the first holder 110. When the first holder 110 is inserted into the mounting hole 212 of the first cooling portion 210, the cylindrically-shaped spring 130 applies elastic pressure to the first cooling portion 210 so that the first cooling portion 210 can better contact the chip 400. With the cylindrically-shaped spring 130, the first cooling portion 210 can contact the chip 400 flexibly and adjustably so as to prevent the first cooling portion 210 from applying excessive pressure to the chip 400 and damaging the chip 400.

In some embodiments, as shown in FIG. 2, the first holder 110 further comprises a limiting protrusion 115 adjoining the first flexible latch 113. When the first holder 110 is inserted from the first side 310 of the carrier 300 into the mounting hole 212 of the first cooling portion 210 and the carrier 300, the limiting protrusion 115 passes through the carrier 300 and protrudes at the second side 320 of the carrier 300. With the limiting protrusion 115, the gap 240 (FIG. 4) between the second cooling portion 220 and the second side 320 of the carrier 300 can be limited so as to prevent the second cooling portion 220 from damaging the electronic device arranged at the second side 320 of the carrier 300. Moreover, the gap 240 reserved between the second cooling portion 220 and the carrier 300 can increase the contact face between the cooling portion and the air, thereby facilitating heat dissipation of the second cooling portion 220.

In some embodiments, as shown in FIG. 2, the second holder 120 comprises a second flexible latch 122 located at an upper end 124 of the second cylindrically-shaped rod 121. Herein, the second flexible latch 122 is formed in an inverted trapezoid shape. In particular, the second flexible latch 122 protrudes from the second cylindrically-shaped rod 121 in the horizontal direction x perpendicular to the longitudinal direction z, and the outer peripheral dimension of the second flexible latch 122 gradually decreases from top to bottom.

When the first holder 110 and the second holder 120 are assembled to fix the second cooling portion 220 of the double-sided heat sink 200, the second flexible latch 122 may pass through the through-hole 122 from the lower end 116 of the first holder 110 along the longitudinal direction z. By means of the second flexible latch 122 protruding in the horizontal direction x and dimensioned larger than the through-hole 112, the upper end 124 of the second holder 120 can be coupled to the upper end 117 of the first holder 110. Here, due to the flexible design of the second flexible latch 122, the first holder 110 and the second holder 120 can be separated from each other again under the application of an external force.

In some other alternative embodiments, the second cylindrically-shaped rod 121 of the second holder 120 may be arranged with an external thread. Correspondingly, the through-hole 112 of the first holder 110 may be disposed with an internal thread. In this manner, the first holder 110 and the second holder 120 can be coupled with each other in a threaded manner.

In some embodiments, as shown in FIG. 2, the second holder 120 further comprises a second flange 123 located at a lower end 125 of the second cylindrically-shaped rod 121. The second flange 123 is formed to have a greater dimension than the second cylindrically-shaped rod 121 in the horizontal direction x. When the second holder 120 is inserted into the mounting hole 222 of the second cooling portion 220, the second flange 123 is fixed to the lower side of the second cooling portion 220 so as to limit the position of the second cooling portion 220 in the longitudinal direction z.

By means of the cooperative use of the second flexible latch 122 and the second flange 123, the second cooling portion 220 can be limited from two sides in the longitudinal direction z by means of the second holder 120 so as to prevent the second cooling portion 220 from vibrating or shaking, for instance, during the transporting process.

Figure 3:
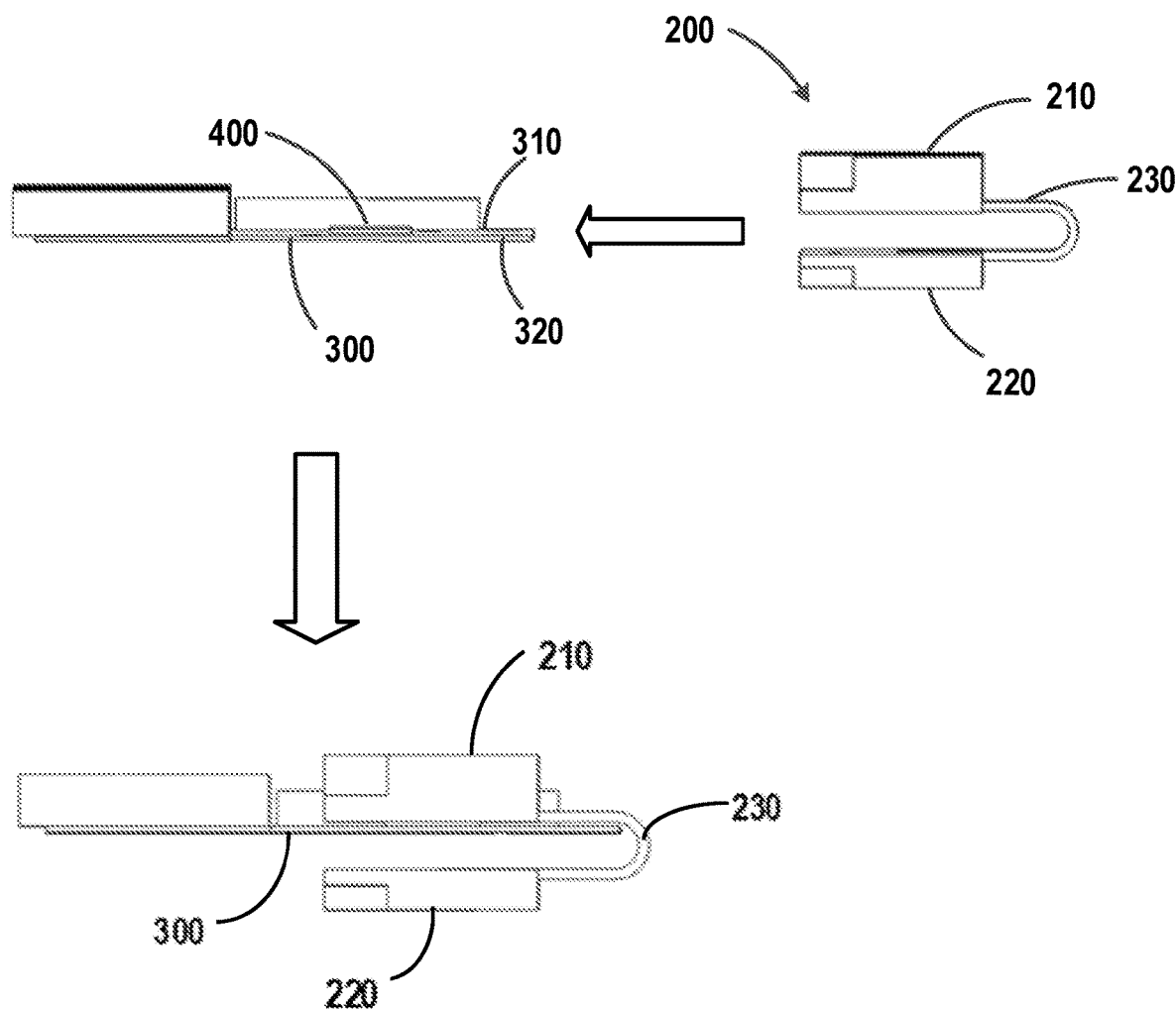
FIG. 3 is an installation schematic diagram of fixing a double-sided heat sink by means of a fixing device in accordance with embodiments of the present disclosure.
Figure 4:
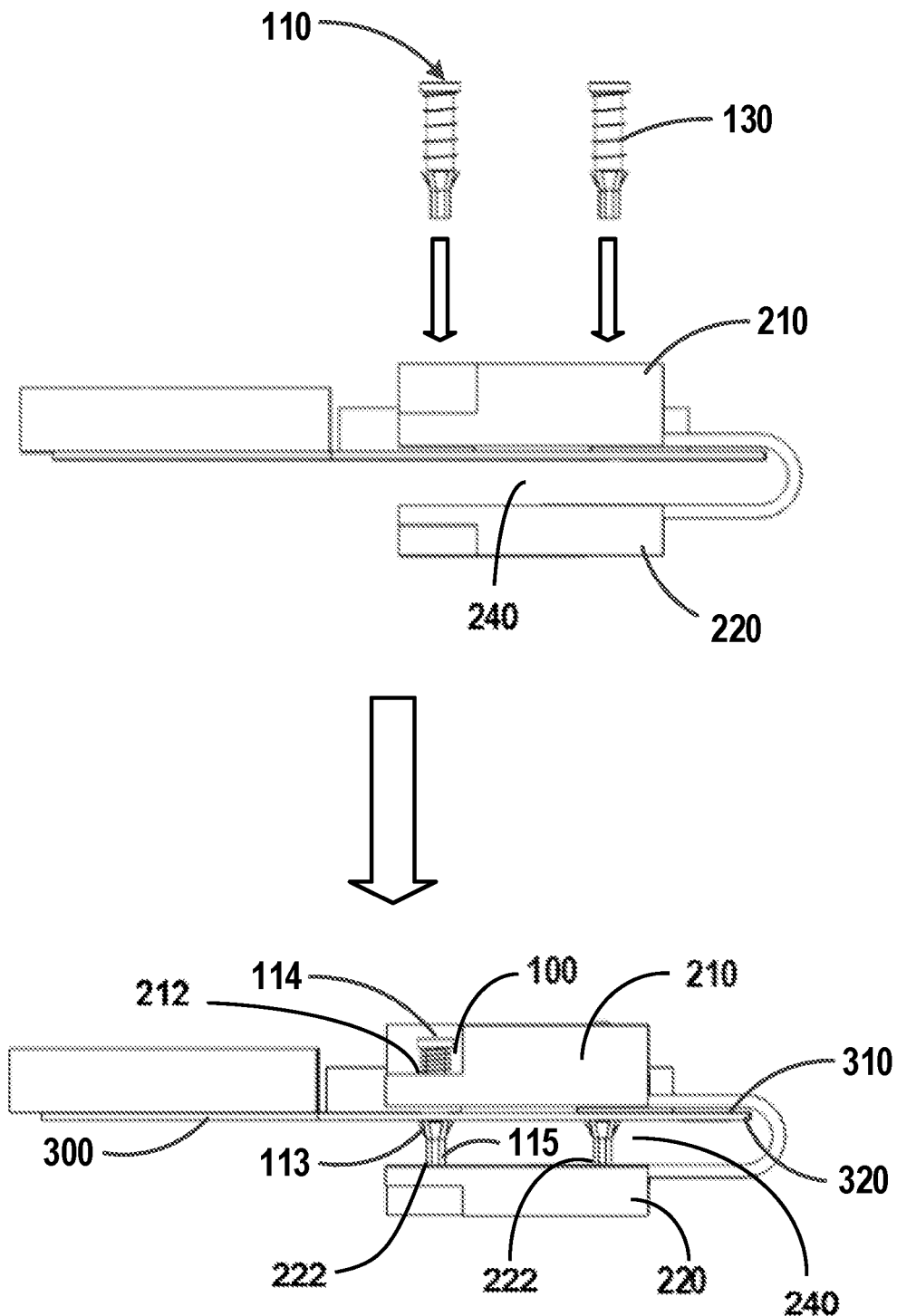
FIG. 4 is an installation schematic diagram of fixing a double-sided heat sink by means of a fixing device in accordance with embodiments of the present disclosure.
Figure 5:
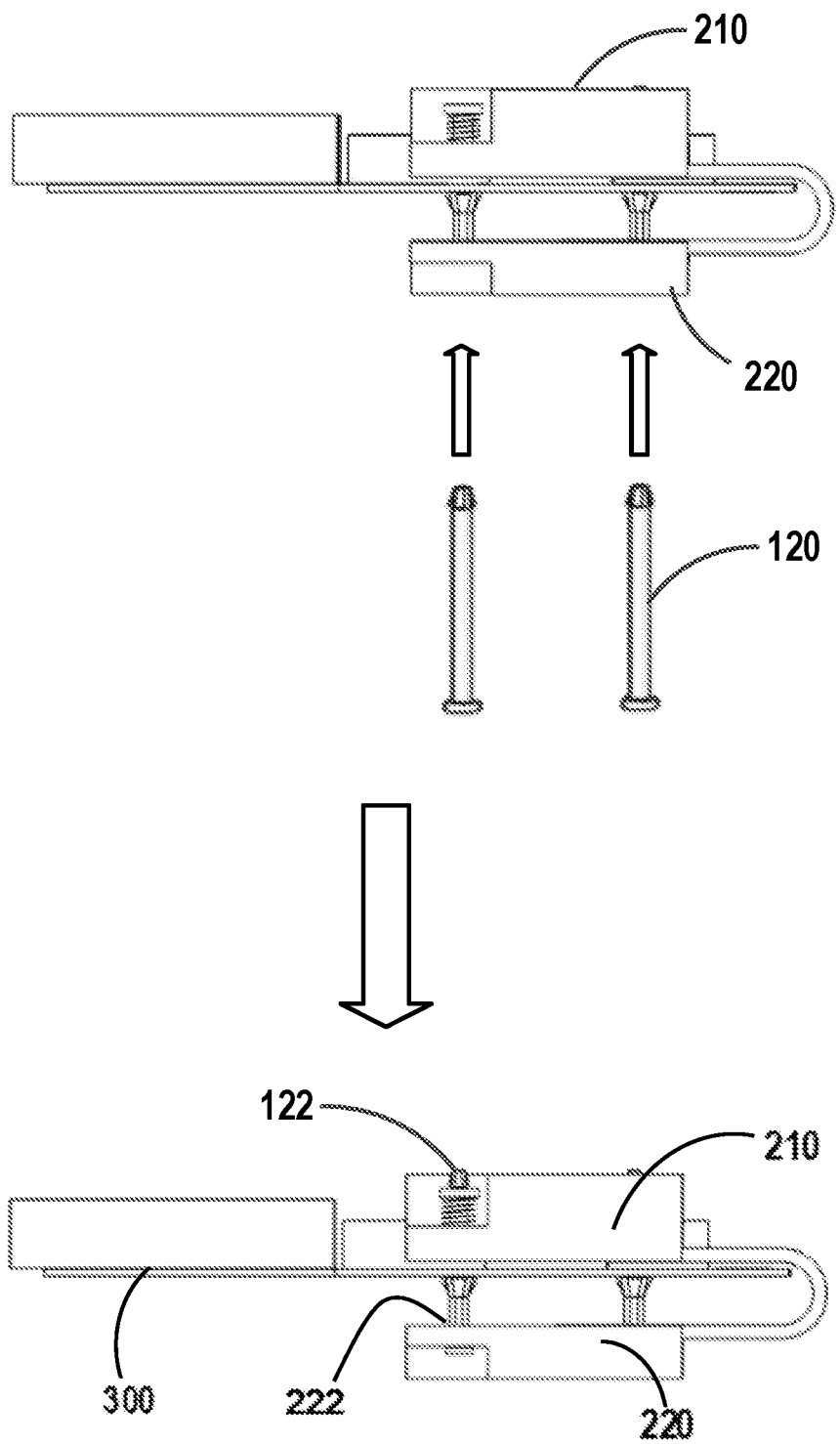
FIG. 5 is an installation schematic diagram of fixing a double-sided heat sink by means of a fixing device in accordance with embodiments of the present disclosure.

FIGS. 3-5 are schematic diagrams of fixing the double-sided heat sink 200 by means of a fixing device 100 in accordance with embodiments of the present disclosure.

As shown in FIG. 3, the double-sided heat sink 200 is disposed at the carrier 300 so that the first cooling portion 210 is located at the first side 310 of the carrier 300 and contacts the chip 400 on the carrier 300 while the second cooling portion 220 is located at the second side 320 of the carrier 300.

As shown in FIG. 4, the first holder 110 of the fixing device 100 is inserted from the first side 310 of the carrier 300 into the mounting hole 212 of the first cooling portion 210 and the carrier 300, so that the first flexible latch 113 is fixed to the second side 320 of the carrier 300, thereby limiting the first cooling portion 210 from the lower side. By means of the cylindrically-shaped spring 130 arranged between the first flange 114 and the first flexible latch 113, a downward pressure is applied to the first cooling portion 210, thereby limiting the first cooling portion 210 from the upper side. The limiting protrusion 115 abuts the second cooling portion 220 and limits the second cooling portion 220 from the upper side.

As shown in FIG. 5, the second holder 120 of the fixing device 100 is inserted from the second side 320 of the carrier 300 into the mounting hole 222 of the second cooling portion 220 and the through-hole 112 of the first holder 110, so that the second flexible latch 122 of the second holder 120 protrudes from the through-hole 112 from the upper side and is coupled to the first holder 110. The second flange 123 of the second holder 120 is fixed to the lower side of the second cooling portion 220 so as to limit the second cooling portion 220 from the lower side.

With the fixing device 100 in accordance with embodiments of the present disclosure, the double-sided heat sink 200 can be fastened to the carrier 300 from three directions, so as to prevent the double-sided heat sink 200 from vibrating during the transporting and mounting processes, thereby further preventing the heat pipe 230 from creaking due to vibration.

Various embodiments of the present disclosure have been described above. The above explanation is illustrative rather than exhaustive and is not limited to the disclosed embodiments. Without departing from the scope and spirit of each explained embodiment, many alterations and modifications are obvious for those ordinary skilled in the art. The selection of terms in the text aims to best explain principle, actual application or technical improvement in the market of each embodiment or make each embodiment disclosed in the text comprehensible for those ordinary skilled in the art.

We claim:

1. A fixing device for mounting a double-sided heat sink on a carrier, comprising:
a first holder comprising a first cylindrically-shaped rod, wherein the first cylindrically-shaped rod passes through a first cooling portion of the double-sided heat sink and a mounting hole of the carrier to fix the first cooling portion to a first side of the carrier, the first cylindrically-shaped rod comprising a through-hole extending along a longitudinal direction; and
a second holder comprising a second cylindrically-shaped rod, wherein the second cylindrically-shaped rod passes through a mounting hole of a second cooling portion of the double-sided heat sink and through the through-hole of the first cylindrically-shaped rod, such that the second holder is coupled with the first holder to fix the second cooling portion to a second side of the carrier opposite to the first side;
wherein the first holder comprises:
a first flexible latch located at a first end of the first cylindrically-shaped rod, the first flexible latch passing through the first cooling portion and the mounting hole of the carrier from the first side of the carrier to fix the first end of the first holder to the second side of the carrier.

2. The fixing device according to claim 1, wherein the first holder comprises:
a first flange located at a second end of the first cylindrically-shaped rod, the first flange limiting movement of the first cooling portion in the longitudinal direction.

3. The fixing device according to claim 1, wherein the first holder comprises:
a protrusion adjoining the first flexible latch, the protrusion defining a gap between the second cooling portion and the second side of the carrier.

4. The fixing device according to claim 2, further comprising:
a cylindrically-shaped spring arranged between the first flange and the first flexible latch.

5. The fixing device according to claim 1, wherein the second holder comprises:
a second flexible latch located at a first end of the second cylindrically-shaped rod, the second flexible latch passing through the mounting hole of the second cooling portion and through the through-hole of the first holder from the second side of the carrier to couple the first end of the second holder to the second end of the first holder.

6. The fixing device according to claim 5, wherein the second flexible latch is formed in an inverted trapezoid shape.

7. The fixing device according to claim 1, wherein the first flexible latch is formed in an inverted trapezoid shape.

8. A fixing device for mounting a double-sided heat sink on a carrier, comprising:
a first holder comprising a first cylindrically-shaped rod, wherein the first cylindrically-shaped rod passes through a first cooling portion of the double-sided heat sink and through a mounting hole of the carrier to fix the first cooling portion to a first side of the carrier, the first cylindrically-shaped rod comprises a through-hole extending along a longitudinal direction; and
a second holder comprising a second cylindrically-shaped rod, wherein the second cylindrically-shaped rod passes through a mounting hole of a second cooling portion of the double-sided heat sink and through the through-hole of the first cylindrically-shaped rod, such that the second holder is coupled with the first holder to fix the second cooling portion to a second side of the carrier opposite to the first side;
wherein the second holder comprises:
a second flexible latch located at a first end of the second cylindrically-shaped rod, the second flexible latch passing through the mounting hole of the second cooling portion and the through-hole of the first holder from the second side of the carrier to couple the first end of the second holder to the second end of the first holder.

9. The fixing device according to claim 8, wherein the second flexible latch is formed in an inverted trapezoid shape.

10. The fixing device according to claim 8, wherein the first holder comprises:
a first flange located at a second end of the first cylindrically-shaped rod, the first flange limiting movement of the first cooling portion in the longitudinal direction.

11. The fixing device according to claim 8, wherein the first holder comprises:
a protrusion adjoining the first flexible latch, the protrusion being arranged to define a gap between the second cooling portion and the second side of the carrier.

12. The fixing device according to claim 10, further comprising:
a cylindrically-shaped spring arranged between the first flange and the first flexible latch.

13. The fixing device according to claim 8, wherein the second holder comprises:
a second flange located at a second end of the second cylindrically-shaped rod, the second flange limiting movement of the second cooling portion in the longitudinal direction.

14. A heat dissipating system, comprising:
a double-sided heat sink;
a carrier, on which a chip is arranged; and
a fixing device mounting the double-sided heat sink on the carrier, wherein the fixing device comprises:
a first holder comprising a first cylindrically-shaped rod, wherein the first cylindrically-shaped rod passes through a first cooling portion of the double-sided heat sink and through a mounting hole of the carrier to fix the first cooling portion to a first side of the carrier, and the first cylindrically-shaped rod comprises a through-hole extending along a longitudinal direction; and
a second holder comprising a second cylindrically-shaped rod, wherein the second cylindrically-shaped rod passes through a mounting hole of a second cooling portion of the double-sided heat sink and through the through-hole of the first cylindrically-shaped rod, such that the second holder is coupled with the first holder to fix the second cooling portion to a second side of the carrier opposite to the first side;
wherein the fixing device includes at least one of:
a first flexible latch associated with the first holder and located at a first end of the first cylindrically-shaped rod, the first flexible latch passing through the first cooling portion and through the mounting hole of the carrier from the first side of the carrier to fix the first end of the first holder to the second side of the carrier; and a second flexible latch associated with the second holder and located at a first end of the second cylindrically-shaped rod, the second flexible latch passing through the mounting hole of the second cooling portion and through the through-hole of the first holder from the second side of the carrier to couple the first end of the second holder to the second end of the first holder;

wherein the double-sided heat sink comprises:
a heat pipe, through which the first cooling portion and the second cooling portion are connected to perform heat transfer.

15. The heat dissipating system according to claim 14, wherein the fixing device comprises each of the first flexible latch and the second flexible latch.

16. The heat dissipating system according to claim 15, wherein the first holder comprises:
a protrusion adjoining the first flexible latch, the protrusion being arranged to define a gap between the second cooling portion and the second side of the carrier.

17. The heat dissipating system according to claim 15, wherein the first holder comprises:
a first flange located at a second end of the first cylindrically-shaped rod, the first flange limiting movement of the first cooling portion in the longitudinal direction.

18. The heat dissipating system according to claim 17, further comprising:
a cylindrically-shaped spring arranged between the first flange and the first flexible latch.

19. The heat dissipating system according to claim 15, wherein the first flexible latch and the second flexible latch each includes an inverted trapezoid shape.

20. The heat dissipating system according to claim 14, wherein the second holder comprises:
a second flange located at a second end of the second cylindrically-shaped rod, the second flange limiting movement of the second cooling portion in the longitudinal direction.

* * * * *